(12) United States Patent
Okazaki et al.

(10) Patent No.: US 6,718,088 B2
(45) Date of Patent: Apr. 6, 2004

(54) MULTIPLEX LASER LIGHT SOURCE AND EXPOSURE APPARATUS

(75) Inventors: Yoji Okazaki, Kaisei-machi (JP); Kazuhiko Nagano, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 121 days.

(21) Appl. No.: 09/985,855

(22) Filed: Nov. 6, 2001

(65) Prior Publication Data

US 2002/0090172 A1 Jul. 11, 2002

(30) Foreign Application Priority Data

Nov. 6, 2000 (JP) .................................. 2000-336850
Sep. 10, 2001 (JP) .................................. 2001-273849

(51) Int. Cl.$^7$ .......................... G02B 6/26; G02B 6/42; G02B 6/32; G02B 6/30; H01S 3/30

(52) U.S. Cl. .............................. 385/27; 385/33; 385/49; 398/43; 398/48; 372/6

(58) Field of Search ........................ 398/43, 48; 372/6

(56) References Cited

U.S. PATENT DOCUMENTS 6,288,833 B1 * 9/2001 Kasamatsu .................. 359/333
6,362,919 B1 * 3/2002 Flanders ..................... 359/497

* cited by examiner

*Primary Examiner*—Brian Hooly
*Assistant Examiner*—Kevin S. Wood
(74) *Attorney, Agent, or Firm*—Sughrue Mion, PLLC

(57) ABSTRACT

Disclosed herein is a multiplex laser light source equipped with a plurality of semiconductor lasers, a single multi-mode optical fiber, and a light-collecting optics system for collecting laser beams emitted from the plurality of semiconductor lasers and then coupling the collected laser beams to the multi-mode optical fiber.

54 Claims, 13 Drawing Sheets

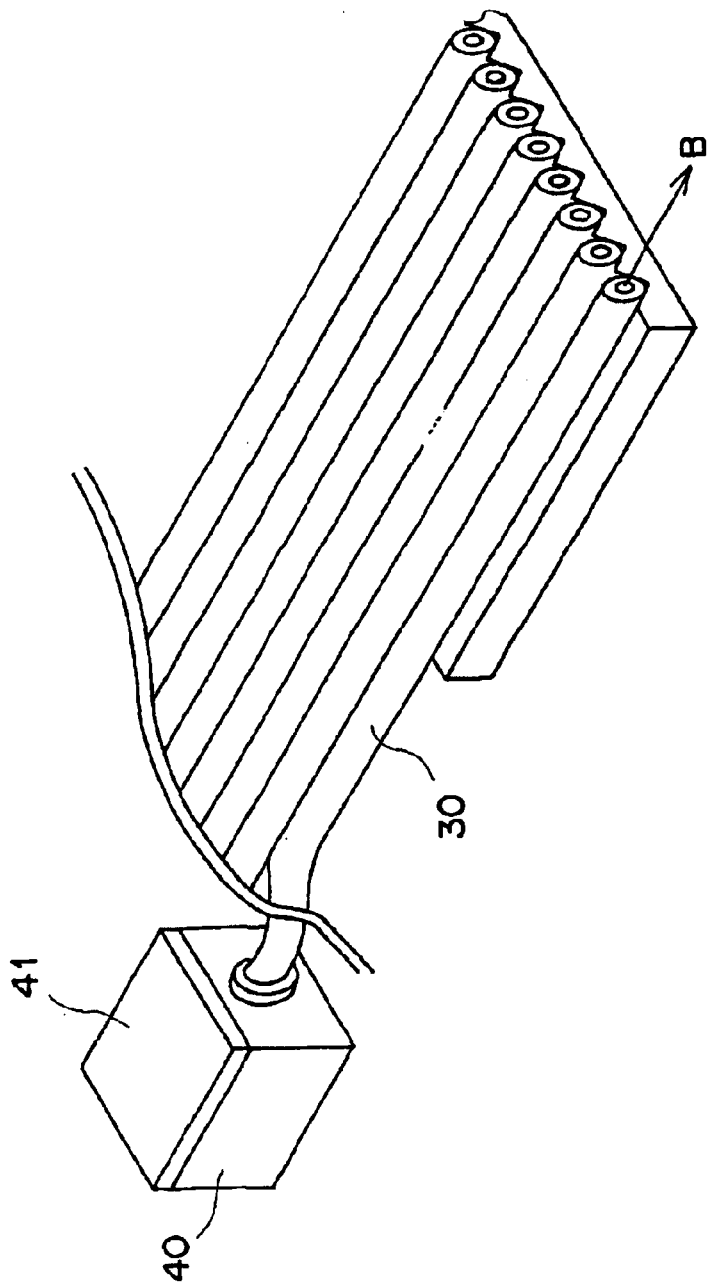

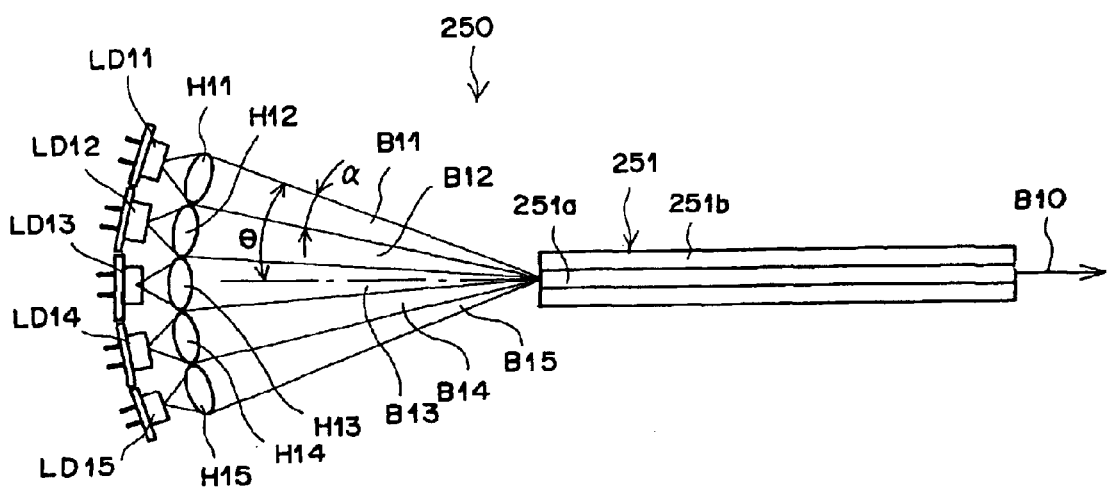
F I G. 10

DIRECTION OF A WIND GENERATED BY A COOLING BLOWER

MULTIPLEX LASER LIGHT SOURCE AND EXPOSURE APPARATUS

BACKGROUND OF THE INVENTION

1. Field of the Invention

The present invention relates to a multiplex laser light source, and more particularly to a multiplex laser light source that multiplexes laser beams emitted from a plurality of semiconductor lasers by making use of optical fibers. The invention also relates to an exposure apparatus which employs the multiplex laser light source as the exposure light source.

2. Description of the Related Art

As conventional devices that can emit a laser beam in an ultraviolet region, a wavelength conversion laser (which converts infrared light, emitted from a solid-state excitation laser, to a third harmonic in an ultraviolet region), an excimer laser, and an argon-ion (Ar) laser have been put to practical use.

Furthermore, a GaN semiconductor laser has recently been provided as a device that can emit a laser beam having a wavelength near 400 nm (see Jpn. Appl. Phys. Lett., vol. 37, 1998, p. L1020).

It is also conceivable that the light source to emit a laser beam of such wavelengths can be applied as an exposure light source for an exposure apparatus that exposes a photosensitive material which has sensitivity in a predetermined wavelength region including an ultraviolet region of 350 to 420 nm (hereinafter referred to as an ultraviolet region). The exposure light source in that case is required to have enough output to expose the photosensitive material.

The aforementioned excimer laser, however, has the problem that it is bulky and costly and has a high maintenance cost.

In addition, the aforementioned wavelength conversion laser, which converts infrared light to a third harmonic in an ultraviolet region, is very low in wavelength conversion efficiency, so it is extremely difficult to obtain high output. At present, a solid-state medium is excited with a semiconductor laser of 30 W to emit a 10-W fundamental wave of wavelength 1064 nm; the fundamental wave is converted to a 3-W second harmonic of wavelength 532 nm; and a 1-W third harmonic of wavelength 355 nm, which is the sum frequency between them, is obtained. The electro-optic efficiency of the semiconductor laser in that case is on the order of 50%, and the efficiency of converting infrared light to ultraviolet light is very low, typically on the order of 1.7%. Such a wavelength conversion laser is considerably costly because it employs an expensive wavelength conversion element.

Furthermore, the aforementioned Ar laser has the problem that the electro-optic efficiency is very low (0.005%) and the lifetime is very short (on the order of 1000 hours).

On the other hand, for the aforementioned GaN semiconductor laser, a GaN crystal substrate in a low dislocation region is not obtained. Because of this, a low dislocation region on the order of 5 $\mu$m is formed by a growth method (ELOG), and a laser region is formed on the low dislocation region to achieve high output and high reliability. However, even in the GaN semiconductor laser fabricated in this manner, it is difficult to obtain a low-dislocation substrate over a large area, and consequently, GaN semiconductor lasers with a high output of 500 mW to 1 W have not been put to practical use yet.

As another method for obtaining high-output semiconductor lasers, it is conceivable to obtain an output of 10W by forming 100 cavities which each have a light output of 100 mW. However, it is extremely difficult to produce such a great number of cavities in high throughput. Particularly, for GaN semiconductor lasers, in which a throughput of 99% or greater is difficult even in the case of a single cavity, it is still more difficult to produce a great number of cavities in high throughput.

SUMMARY OF THE INVENTION

The present invention has been made in view of the aforementioned circumstances. Accordingly, it is an object of the present invention to provide an inexpensive multiplex laser light source in which high output is obtained. Another object of the invention is to provide an exposure apparatus that is capable of exposing photosensitive materials with high-intensity laser light by employing the multiplex laser light source mentioned above.

To achieve the aforementioned objects of the present invention, there is provided a multiplex laser light source comprising:

a plurality of semiconductor lasers;

a single multi-mode optical fiber; and a light-collecting optics system for collecting laser beams emitted from the plurality of semiconductor lasers and then coupling the collected laser beams to the multi-mode optical fiber.

In a preferred form of the present invention, the aforementioned plurality of semiconductor lasers are disposed so that their light-emitting points are arranged in a row in a first direction parallel to their active layers. The aforementioned light-collecting optics system comprises a plurality of collimator lenses, each having a first aperture diameter in the first direction and a second aperture diameter larger than the first aperture diameter in a second direction perpendicular to the first direction, and provided so that they correspond to the plurality of the semiconductor lasers. The light-collecting optics system further comprises a collective lens for collecting the plurality of laser beams collimated by the plurality of collimator lenses and then converging the collimated laser beams on an end face of the multi-mode optical fiber.

In another preferred form of the present invention, the aforementioned plurality of collimator lenses are formed integrally with one another and are constructed as a lens array. In addition, a block on which the aforementioned plurality of semiconductor lasers are mounted is divided into a plurality of subblocks, and the subblocks are bonded with one another.

In still another preferred form of the present invention, the aforementioned plurality of semiconductor lasers comprise 3 to 10 semiconductor lasers arranged in a row. It is further preferable that the plurality of semiconductor lasers comprise 6 or 7 semiconductor lasers arranged in a row. Each semiconductor laser has a light-emitting width of 1.5 to 5 $\mu$m, preferably 2 to 3 $\mu$m. It is desirable that the semiconductor lasers be GaN semiconductor lasers.

In the multiplex laser light source of the present invention, it is desirable that the aforementioned multi-mode optical fiber have a core diameter of 50 $\mu$m or less and a numerical aperture of 0.3 or less. It is further desirable that the value of (core diameter×numerical aperture) of the multi-mode optical fiber be 7.5 $\mu$m or less.

In the multiplex laser light source of the present invention, it is desirable that a plurality of semiconductor lasers be arrayed and fixed two-dimensionally when viewed from a side where the laser beams are received.

The multiplex laser light source of the present invention may employ only a single multi-mode optical fiber. However, it is desirable that the multiplex laser light source employ a plurality of multi-mode optical fibers. In this case, each of the plurality of multi-mode optical fibers may be combined with a plurality of semiconductor lasers and a light-collecting optics system so that a high-output laser beam is emitted from each multi-mode optical fiber. In such a case, it is desirable that at least the exit end portions of the multi-mode optical fibers be disposed in one-dimensional array form or bundle form.

In accordance with the present invention, there is provided an exposure apparatus having a light source. The light source comprises the aforementioned multiplexer laser light source in which a plurality of multi-mode optical fibers are disposed in one-dimensional array form or bundle form.

According to the multiplex laser light source of the present invention, laser beams emitted from a plurality of semiconductor lasers are collected and are then coupled to the multi-mode optical fiber. Thus, the multiplex laser light source of the present invention is extremely simple in construction. Particularly, since the multiplex laser light source does not require elements difficult to fabricate, it can be formed at low cost.

According to the multiplex laser light source of the present invention, a plurality of semiconductor lasers are disposed so that their light-emitting points are arranged in a row in a first direction parallel to their active layers. In addition, the light-collecting optics system is constructed of (1) a plurality of collimator lenses, each having a first aperture diameter in the first direction and a second aperture diameter larger than the first aperture diameter in a second direction perpendicular to the first direction, and provided so that they correspond to the plurality of the semiconductor lasers, and (2) a collective lens for collecting the plurality of laser beams collimated by the plurality of collimator lenses and then converging the collimated laser beams on an end face of the multi-mode optical fiber. With this constitution, the pitch between the semiconductor lasers can be made shorter and the semiconductor lasers can be disposed in higher density. If a plurality of semiconductor lasers are disposed in higher density, the positional shift of laser beams at the end face of the optical fiber can be reduced so that it becomes smaller. Therefore, there is obtained an advantage that the plurality of semiconductor lasers, the multi-mode optical fiber, and the light-collecting optics system can be assembled with relatively low accuracy. Because of this, the number of laser beams that are multiplexed can be increased to obtain higher output. The reason for this will be described in detail along embodiments to be described later.

According to the multiplex laser light source of the present invention, a plurality of collimator lenses are formed integrally with one another and are constructed as a lens array. Therefore, formation of a large ineffective region in the circumferential portion of each lens can be avoided. As a result, the lenses can be disposed in close proximity to one another. Because of this, a plurality of semiconductor lasers can be disposed in even higher density. Therefore, the effect of being able to reduce positional accuracy, and the effect of being able to obtain high output by increasing the number of laser beams that are multiplexed, become more conspicuous. Furthermore, alignment of the collimator lenses with respect to the multi-mode optical fiber is simplified because all that is required is to make adjustments to a single lens array.

In the fields of printing and medical imaging, or in the case where an image, obtained by a printed circuit board (PCB), a plasma display (PDP), a liquid crystal display (LCD), etc., is exposed and recorded on photosensitive material, a laser spot becomes finer and therefore a high-resolution image can be exposed, if a multi-mode optical fiber with a core diameter of 50 $\mu$m or less is used. In addition, if the multi-mode optical fiber has a numerical aperture (NA) of 0.3 or less, enough focal depth to expose a high-fine image is assured and therefore it becomes possible to expose an image having high sharpness.

According to the multiplex laser light source of the present invention, the value of (core diameter×numerical aperture) of the multi-mode optical fiber is 7.5 $\mu$m or less. As the value, there are 50 $\mu$m×0.15, 40 $\mu$m×0.188, 30 $\mu$m×0.25, 25 $\mu$m×0.3, etc. If a multi-mode optical fiber with such a characteristic is employed, a laser beam from each semiconductor laser can be collimated with a collimator lens of the same NA as the aforementioned NA. In addition, a multiplexed laser beam can be collected to a spot of 25 $\mu$m or less, with a collective lens having an NA of 0.3. This makes it possible to assure high resolution and enough focal depth.

According to the multiplex laser light source of the present invention, a block on which a plurality of semiconductor lasers are mounted is divided into a plurality of subblocks, and the subblocks are bonded with one another. Therefore, the mounting rate can be enhanced, compared with the case where semiconductor lasers are all mounted on a single block. For example, in the case where all 6 semiconductor lasers are mounted on a single block when a mounting rate for a single semiconductor laser is 98%, the total mounting rate is 86% (=0.98$^6$×100). On the other hand, in the case where 3 semiconductor lasers are respectively mounted on two blocks, the total mounting rate is 94% (=0.98$^3$×100) because a joining rate for two blocks is approximately 100%.

According to the multiplex laser light source of the present invention, three or more semiconductor lasers are provided. In conventional multiplexing of polarized beams, only laser beams emitted from two semiconductor lasers can be multiplexed. On the other hand, in the present invention, a multiplexed beam having an output which is higher than that of the conventional case can be obtained. However, in the case where 10 semiconductor lasers are provided when a mounting rate for a single semiconductor laser is 98%, the mounting rate is reduced to 82%. Since a further reduction in the mounting rate must be avoided, it is preferable that the number of semiconductor lasers that can be multiplexed be 10 or less.

In the case where 10 semiconductor lasers are disposed in a row, the mounting accuracy required is extremely high (less than 0.1 $\mu$m) when using a multi-mode optical fiber having a core diameter of 50 $\mu$m or less and an NA of 0.3 or less, or having (core diameter×NA) of 7.5 $\mu$m or less. However, in the case of 6 or 7 semiconductor lasers, the mounting accuracy required is considerably reduced (less than 0.3 to 1 $\mu$m). In addition, in the case of 6 or 7 semiconductor lasers, a high output which is equal to at least two times the output of the case of 3 semiconductor lasers can be obtained.

According to the multiplex laser light source of the present invention, each semiconductor laser has a light-emitting width of 1.5 to 5 $\mu$m and is constructed of a GaN semiconductor laser. As a result, high output (50 mW or greater) can be obtained, compared with the maximum output that is obtained by semiconductor lasers having a perfect single transverse mode structure. In addition, in the multiplex laser light source of the present invention, each semiconductor laser may have a light-emitting width of 5 μm or less. In this case, a light collecting-coupling system comprising 3 or more semiconductor lasers can be constituted with respect to a multi-mode optical fiber having (core diameter×NA) of 7.5 μm or less. Furthermore, in the multiplex laser light source of the present invention, each semiconductor laser may have a light-emitting width of 2 to 3 μm. In this case, in the aforementioned image forming system a light collecting-coupling system comprising 6 or 7 semiconductor lasers can be constituted.

According to the multiplex laser light source of the present invention, a plurality of semiconductor lasers are arrayed two-dimensionally when viewed from a side where the laser beams are received. Therefore, since a great number of semiconductor lasers can be disposed in high density, a great number of laser beams are incident on a single multi-mode optical fiber. As a result, a multiplexed laser beam with higher output can be obtained.

According to the multiplex laser light source of the present invention, at least the exit end portions of the multi-mode optical fibers are disposed in one-dimensional array form or bundle form. Therefore, high-output laser beams can be emitted one-dimensionally or two-dimensionally from the optical fibers. If each of the laser beams emitted one-dimensionally or two-dimensionally is caused to be incident on each modulating portion of a space light modulation element, such as a GLV or DMD where the modulating portions are arrayed in a row or two-dimensionally, the laser beams can be efficiently modulated for image exposure, etc.

Hence, in the exposure apparatus of the present invention with the aforementioned multiplex laser light source as its light source, the space light modulation element is employed so that laser beams emitted two-dimensionally can be irradiated to photosensitive material two-dimensionally. Alternatively, laser beams emitted one-dimensionally or two-dimensionally are irradiated to photosensitive material, and the photosensitive material is moved in a sub or horizontal scanning direction with respect to the laser beams. In this manner, a two-dimensional image can be recorded on the photosensitive material.

BRIEF DESCRIPTION OF THE DRAWINGS

The above and other objects and advantages will become apparent from the following detailed description when read in conjunction with the accompanying drawings wherein:

FIG. 8 is a perspective view of a light source device employing a plurality of multiplex laser light sources;

FIG. 10 is a plan view showing a multiplex laser light source according to a third embodiment of the present invention;

DESCRIPTION OF THE PREFERRED EMBODIMENTS

Figure 1:
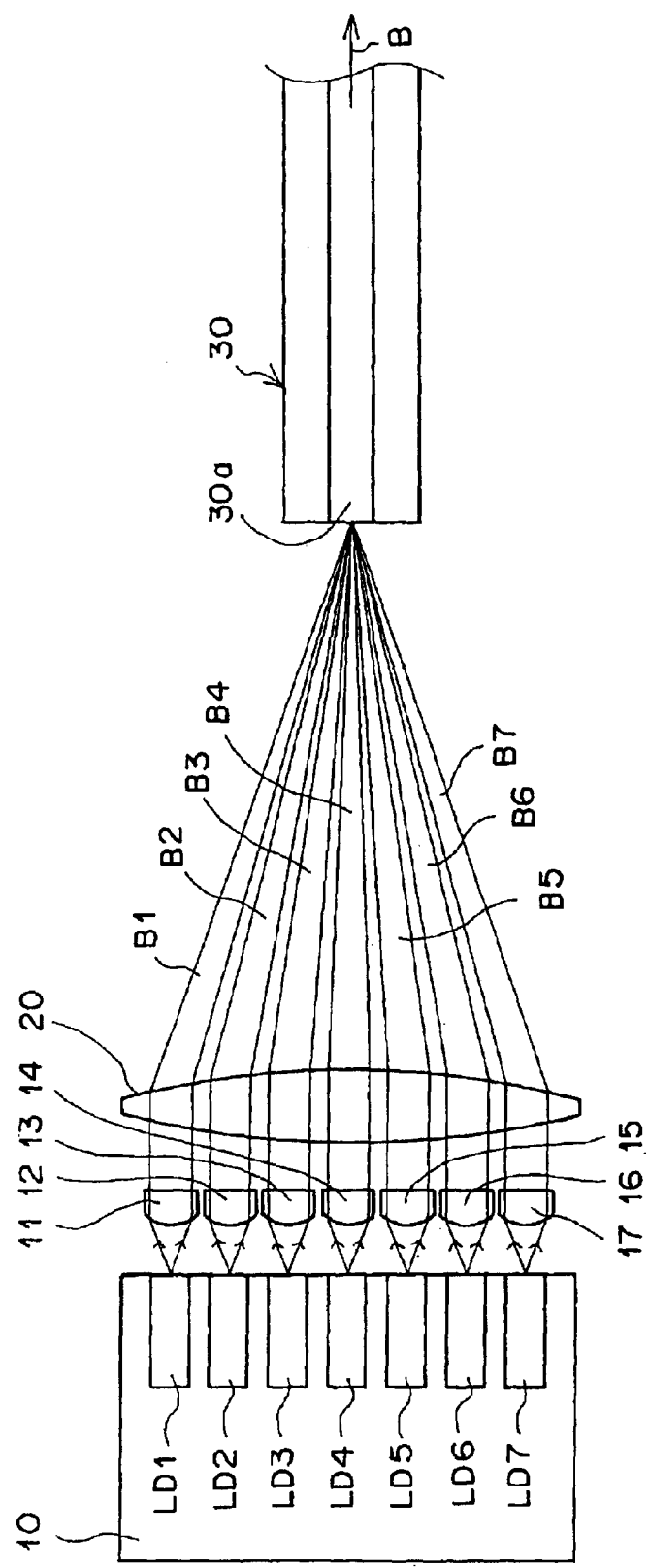
FIG. 1 is a plan view showing a multiplex laser light source according to a first embodiment of the present invention.

Referring now in greater detail to the drawings and initially to FIG. 1, there is shown a multiplex laser light source in accordance with a first embodiment of the present invention. As shown in the figure, the multiplex laser light source is constructed of 7 (seven) transverse multi-mode GaN semiconductor lasers LD1 to LD7 as an example, arrayed on a heat block 10 consisting of copper; collimator lenses 11 to 17 provided so that they correspond to the GaN semiconductor lasers LD1 to LD7; a single collective lens 20; and a single multi-mode optical fiber 30.

Figure 2:
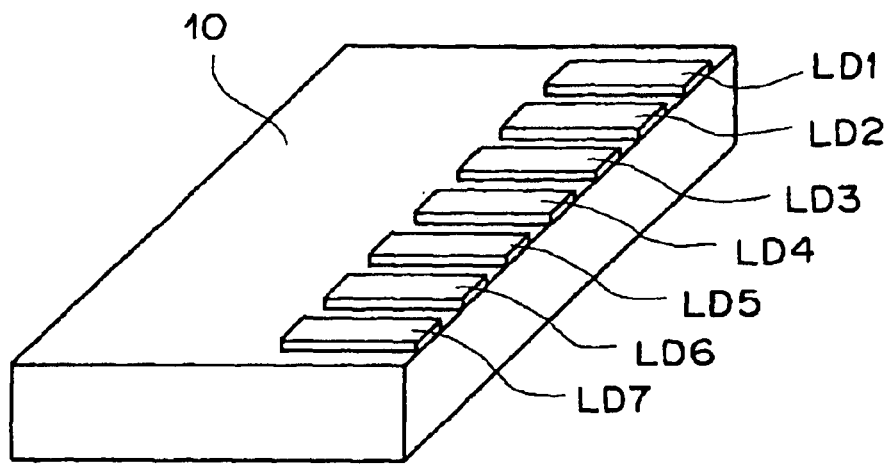
FIG. 2 is a perspective view showing the semiconductor lasers of the multiplex laser light source shown in FIG. 1.

Note that FIG. 1 shows the basic structure of the multiplex laser light source of the first embodiment. Therefore, the configurations of the collimator lenses 11 to 17 and the collective lens 20 are schematically shown. The details of their mounted states will be described later. The mounted state of the GaN semiconductor lasers LD1 to LD7 on the heat block 10 is shown in FIG. 2.

The GaN semiconductor lasers LD1 to LD7 each have, for example, an emission wavelength of 405 nm and a maximum output of 100 mW. Laser beams B1 to B7 emitted divergently from the GaN semiconductor lasers LD1 to LD7 are collimated by the collimator lenses 11 to 17, respectively.

The collimated laser beams B1 to B7 are collected by the collective lens 20 and converge on the entrance end face of the core 30a of the multi-mode optical fiber 30. In the first embodiment, the collimator lenses 11 to 17, and the collective lens 20 constitute a light-collecting optics system. In addition, the collimator lenses 11 to 17, the collective lens 20, and the multi-mode optical fiber 30 constitute a multiplex optics system. That is, the laser beams B1 to B7 collected by the collective lens 20 are incident on the core 30a of the multi-mode optical fiber 30 and propagate through the core 30a and are multiplexed into a single laser beam B. The laser beam B emerges from the exit end face of the multi-mode optical fiber 30. Note that the multi-mode optical fiber 30 may be a step index type, a graded index type, or a combination step-graded index type.

An ultraviolet high-brightness multiplex fiber module comprising the multiplex laser light source will be described in detail with reference to FIGS. 3, 4, and 5. Note in these figures that the configurations and mounted states of the collimator lenses 11 to 17 and collective lens 20 are shown in detail.

In the first embodiment, optical components comprising the multiplex fiber module are housed within a box-shaped package 40 having an upper opening. If the upper opening of the package 40 is closed by a package lid 41, the optical components are sealed hermetically within a closed space, defined by the package 40 and the package lid 41.

A base plate 42 is mounted on the bottom plate of the box-shaped package 40, and the heat block 10 is mounted on the top surface of the base plate 42. A collimator-lens holder 44 to hold the collimator lenses 11 to 17 is mounted on the heat block 10. Furthermore, a collective-lens holder 45 for holding the collective lens 20, and a fiber holder 46 for holding the entrance end portion of the multi-mode optical fiber 30, are mounted on the top surface of the base plate 42. A wire assembly 47, which supplies driving current to the GaN semiconductor lasers LD1 to LD7, is pulled out of the package 40 through an opening formed in the transverse wall of the package 40.

Figure 3:
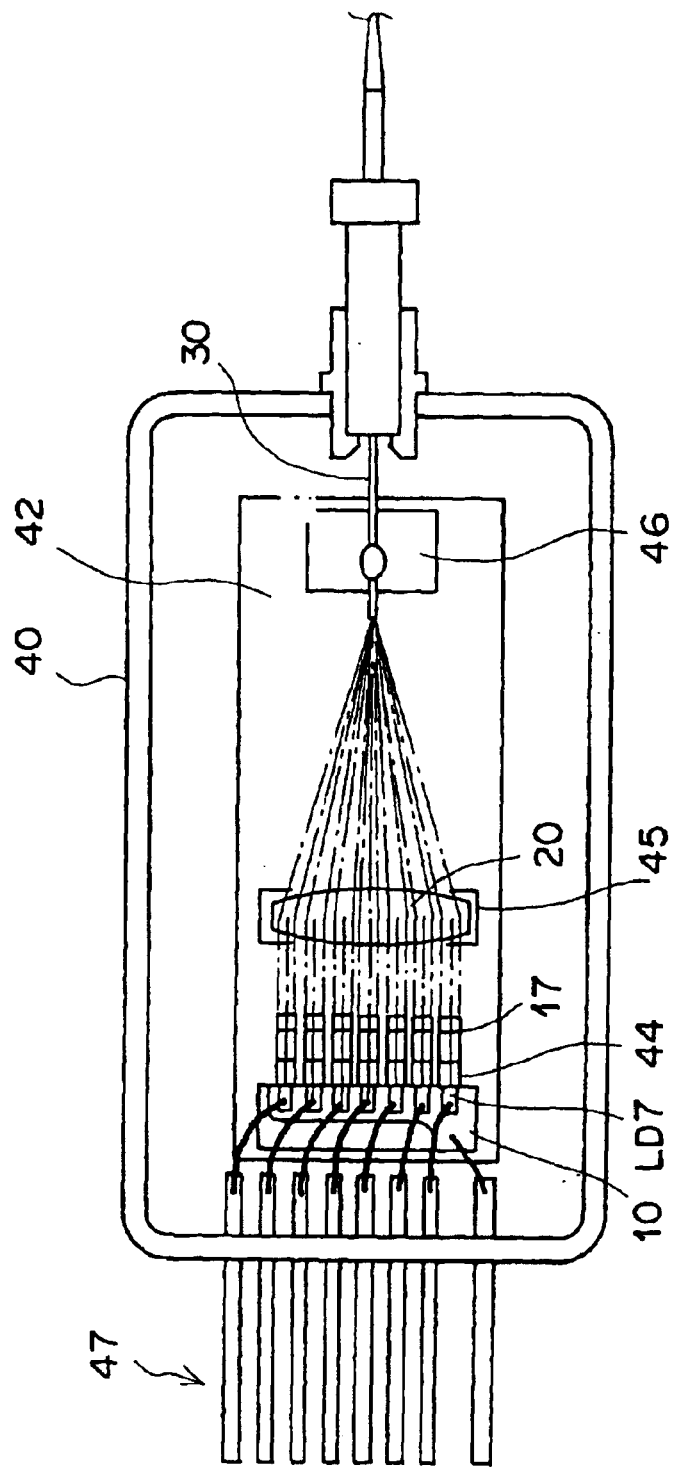
FIG. 3 is a plan view showing an ultraviolet high-brightness multiplex fiber module equipped with the multiplex laser light source of FIG. 1.
Figure 4:
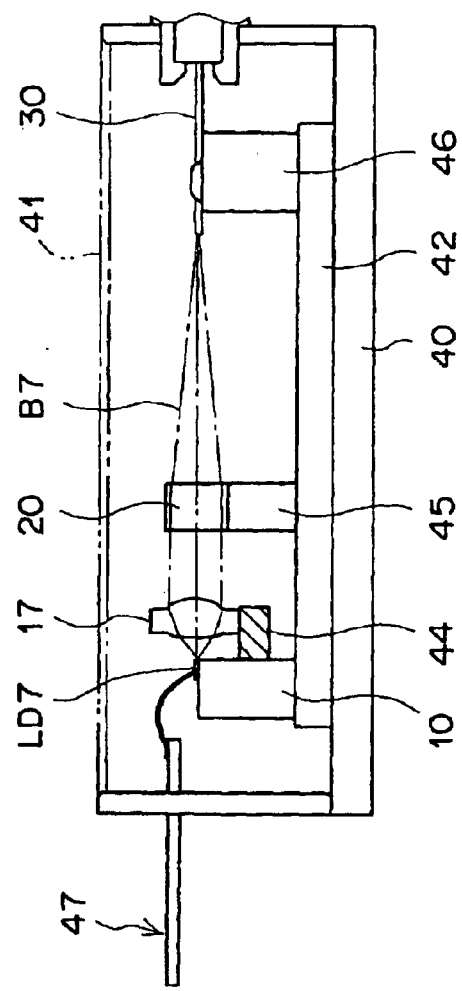
FIG. 4 is a sectional view of the ultraviolet high-brightness multiplex fiber module shown in FIG. 3.

Note in FIG. 3 that to avoid complexity in the figure, only one of the GaN semiconductor lasers LD1 to LD7 is labeled, with reference numeral LD7. Similarly, only one of the collimators 11 to 17 is labeled, with reference numeral 17.

Figure 5:
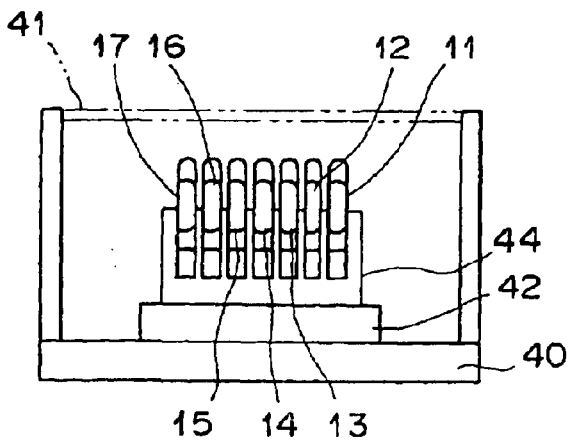
FIG. 5 is a part-front view of the ultraviolet high-brightness multiplex fiber module shown in FIG. 3.
Figure 6A:
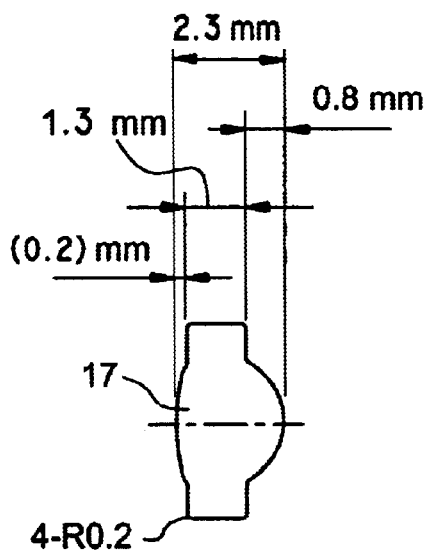
FIG. 6A is an enlarged side view of a collimator lens employed in the multiplex laser light source.

FIG. 5 shows the front view of the mounted portions of the collimator lenses 11 to 17. As shown in the figure, each of the collimator lenses 11 to 17 has a slender configuration is a cut out of an aspherical lens that includes the optical axis thereof. The collimator lenses 11 to 17 are formed, for example, by molding resin or optical glass. The enlarged side configuration and front configuration of the collimator lens 17 are shown FIGS. 6A and 6B, respectively, and the essential portions are represented in millimeter units.

As illustrated in FIGS. 5 and 6, each of the collimator lenses 11 to 17 has a first aperture diameter in a first direction (lateral direction in FIG. 5 where the light-emitting points of the GaN semiconductor lasers LD1 to LD7 are disposed) and a second aperture diameter larger than the first aperture diameter in a second direction (vertical direction in FIG. 5) perpendicular to the first direction. The collimator lenses 11 to 17 are disposed in close proximity in the lateral direction.

On the other hand, the GaN semiconductor lasers LD1 to LD7 emit laser beams B1 to B7 at beam divergence angles, parallel and vertical to the active layer, of 10° and 30° (as an example) with a light emission width of 2 $\mu$m. These GaN semiconductor lasers LD1 to LD7 are disposed so that the light-emitting points thereof are arranged in a row in a direction parallel to the active layer.

Figure 6B:
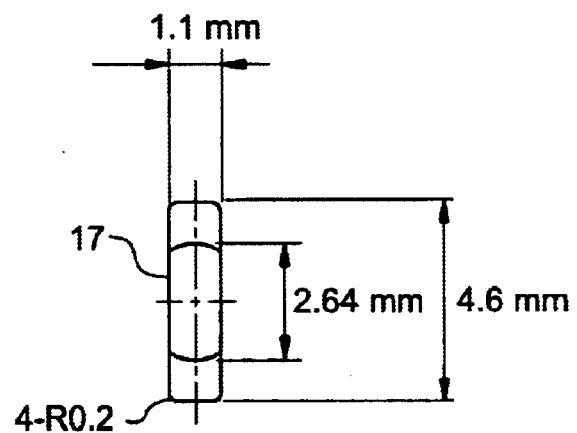
FIG. 6B is an enlarged front view of the collimator lens.

Therefore, the laser beams B1 to B7 emitted from the light-emitting points are incident on the slender collimator lenses 11 to 17, with the direction of the maximum divergence angle aligned with the direction of the large aperture diameter and the direction of the minimum divergence angle aligned with the direction of the small aperture diameter. That is, the slender collimator lenses 11 to 17 correspond to the elliptical cross sections of the incident laser beams B1 to B7 so that their ineffective portions can be minimized. More specifically, each aperture diameter of the collimator lenses 11 to 17 in the first embodiment is 1.1 mm and 4.6 mm in the horizontal direction and vertical direction, as shown in FIG. 6B. Each beam diameter of the laser beams B1 to B7 is 0.1 mm and 2.6 mm in the horizontal direction and vertical direction. In addition, the collimator lenses 11 to 17 each have a focal length ($f_1$) of 3 mm and a numerical aperture (NA) of 0.6, and the pitch between the lenses is 1.25 mm.

Figure 7A:
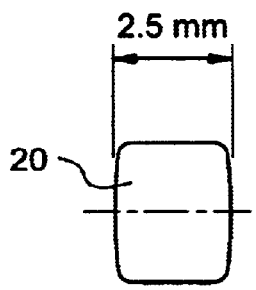
FIG. 7A is an enlarged side view of a collective lens employed in the multiplex laser light source.
Figure 7B:
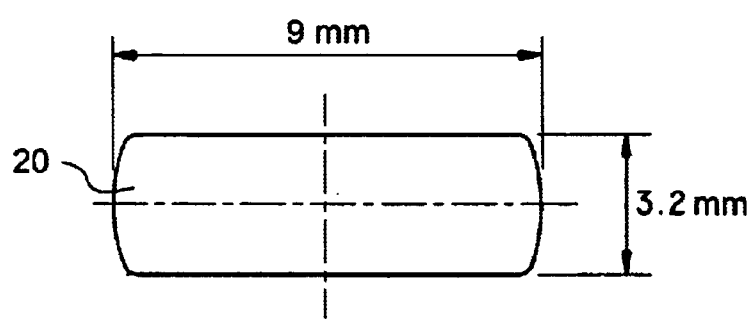
FIG. 7B is an enlarged front view of the collective lens.

FIGS. 7A and 7B show the enlarged side configuration and front configuration of the collective lens 20, the essential portions being represented in millimeter units. As shown in the figures, the collective lens 20 has a slender configuration that is a cut out of an aspherical lens that includes the optical axis thereof. That is, the collective lens 20 is long in the horizontal direction where the collimator lenses 11 to 17 are disposed, and is short in the vertical direction. The focal length ($f_2$) of the collective lens 20 is 12.5 mm and the NA is 0.3. The collective lens 20 is formed, for example, by molding resin or optical glass.

The multi-mode optical fiber 30 is based on a graded index optical fiber (manufactured by Mitsubishi Densen). The fiber core has a graded index profile and the outer peripheral portion has a step index profile. The core diameter is 25 $\mu$m, the NA is 0.3, and the transmission factor at the end face coating is 99.5% or greater. In this case, the aforementioned value of core diameter×NA is 7.5 $\mu$m.

In the first embodiment, the coupling efficiency of the laser beams B1 to B7 onto the multi-mode optical fiber 30 becomes 0.9. Therefore, when the GaN semiconductor lasers LD1 to LD7 each have an output of 100 mW, a multiplexed laser beam B with an output of 630 mW (=100 mW×0.9×7) is obtained.

As shown in FIG. 8, a plurality of ultraviolet high-brightness multiplex fiber modules described above can constitute a light source device, in which a plurality of high-brightness ultraviolet laser beams B are emitted from the exit ends of the multi-mode optical fibers 30 disposed in a one-dimensional array from. More specifically, by disposing 16 (sixteen) multi-mode optical fibers 30 which each emit a multiplexed laser beam B of output 630 mW, an ultrahigh output of 10 W and a high light density of 5 W/mm (=10 W/(125 $\mu$m×16) can be realized. In addition, a high energy efficiency of approximately 15%, which is nearly the same as the light emission efficiency of the GaN semiconductor laser, can be achieved.

It is also possible to dispose the exit end portions of the multi-mode optical fibers 30 in bundle form to constitute a light source device. If they are combined with a one-dimensional or two-dimensional space light modulator, the light source device can be suitably used in an image exposure apparatus. Such an image exposure apparatus will be described in detail later.

A multiplex laser light source according to a second embodiment of the present invention will hereinafter be described with reference to FIG. 9. The same reference numerals will be applied to the same elements as those of FIG. 1, and a description thereof will not be given unless particularly necessary.

The multiplex laser light source of the second embodiment differs from the multiplex laser light source shown in FIG. 1 in that instead of the seven collimator lenses 11 to 17 individually formed, a collimator-lens array 50 with seven lens elements 50a is employed.

In the case of employing the 7 collimator lenses 11 to 17, they are disposed in close proximity to one another, as described previously. That is, the pitch between the collimator lenses is made smaller to enhance the space-utilizing efficiency. The space-utilizing efficiency can be further enhanced by employing the aforementioned collimator-lens array 50. In addition, if the space-utilizing efficiency is enhanced in this manner, there is also obtainable an effect that the GaN semiconductor lasers LD1 to LD7, the light collecting system, and the multi-mode optical fiber 30 can be assembled with relatively low accuracy required in the assembly process. The reason for that will hereinafter be described in detail.

Figure 9:
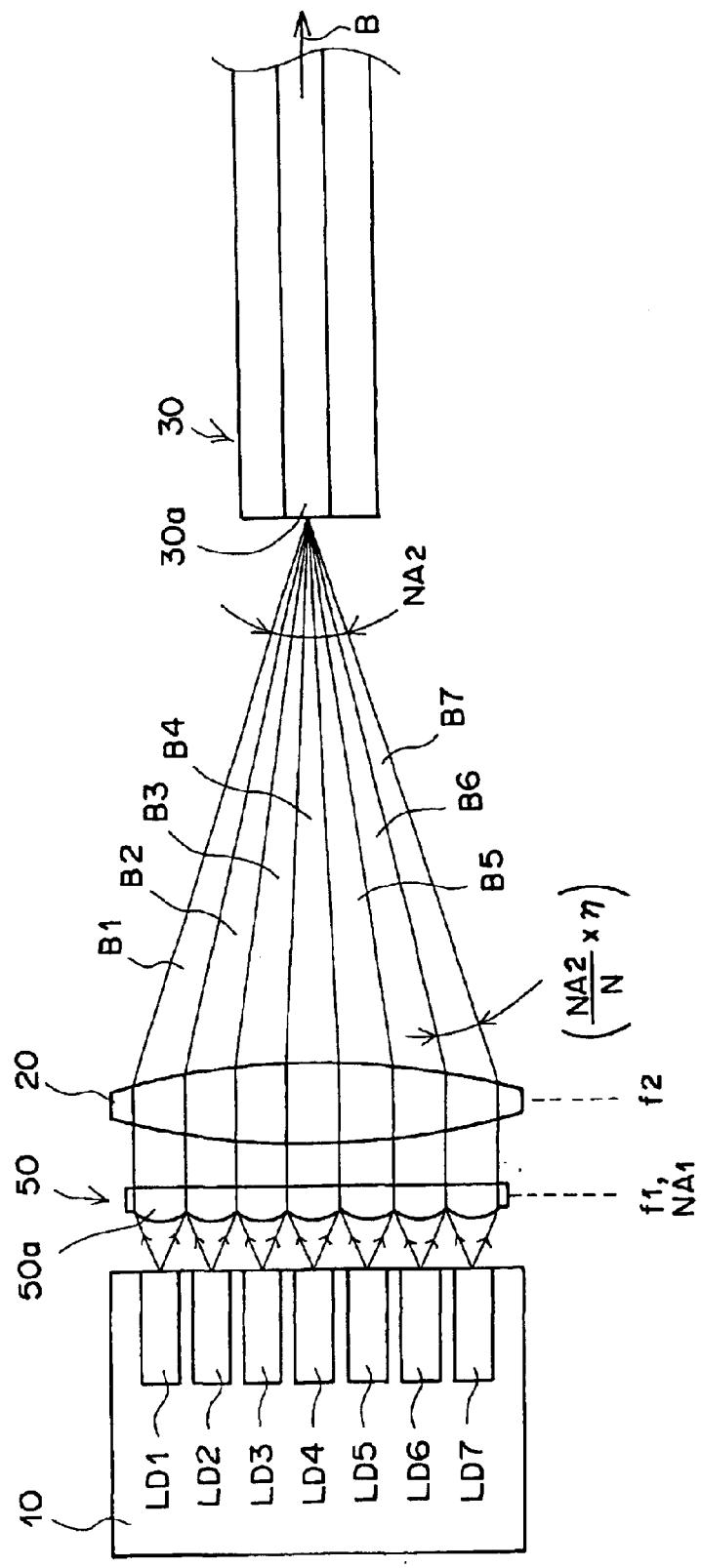
FIG. 9 is a plan view showing a multiplex laser light source according to a second embodiment of the present invention.

As shown in FIG. 9, assume that the focal length and the numerical aperture of each of the lens elements 50a of the collimator-lens array 50 (which correspond to the collimator lenses 11 to 17 shown in FIG. 1) are $f_1$ and $NA_1$. The focal distance of the collective lens 20 is assumed to be $f_2$, the numerical aperture of the multi-mode optical fiber 30 to be $NA_2$, and the space-utilizing efficiency to be η. The space-utilizing efficiency η is defined by the ratio of the area of the optical paths of the seven laser beams B1 to B7 to the area interposed between the laser beam B1 and the laser beam B7. For example, when the optical paths of the seven laser beams B1 to B7 are in direct contact with one another as in the case of FIG. 9, the space-utilizing efficiency η is 1.

The magnification ratio M of the lens system, that is, the ratio of the beam spot diameter, measured on the core end face of the multi-mode optical fiber 30, to the beam spot diameter at the each light-emitting point of the GaN semiconductor lasers LD1 to LD7, is given by the following equation:

$$M = f_2/f_1 = NA_1/\{(NA_2/N) \times \eta\} = (NA_1/NA_2) \times (N/\eta)$$

where N is the number of light beams that are multiplexed.

The above equation indicates that the greater the space-utilizing efficiency η, the lower the magnification ratio M. In addition, as the magnification ratio M becomes smaller, the distance that the laser beams B1 to B7 move on the core end face of the multi-mode optical fiber 30 becomes smaller when there is a shift in the positional relationship between the GaN semiconductor lasers LD1 to LD7, the light collecting system, and the multi-mode optical fiber 30. Therefore, even if the GaN semiconductor lasers LD1 to LD7, the light collecting system, and the multi-mode optical fiber 30 are assembled with relatively low accuracy, the laser beams B1 to B7 can fall on the core 30a of the multi-mode optical fiber 30. If the assembly accuracy is thus made low, the number of laser beams that are multiplexed can be further increased and therefore higher output can be obtained. If the space-utilizing efficiency η is great, the magnification ratio M is reduced. Compensation for this reduction can be made by increasing the number of optical fibers that are multiplexed. Therefore, the number of optical fibers that are multiplexed can be increased.

The two embodiments have been described with regard to the case where seven laser beams are multiplexed into a single laser beam. However, the number of laser beams in the multiplex laser light source of the present invention is not limited to seven. Two or more laser beams can be multiplexed. However, as mentioned previously, it is preferable that the number of laser beams that can be multiplexed be 10 or less.

FIG. 10 shows a third embodiment of the present invention. As an example, the multiplex laser light source of the third embodiment is constructed of 5 (five) GaN semiconductor lasers LD1 to LD5 and a multiplex optics system 250.

The GaN semiconductor lasers LD11 to LD15 each have, for example, an emission wavelength of 400 nm and an output of 50 mW. Collective lenses H11 to H15 are provided so that they correspond to the GaN semiconductor lasers LD11 to LD15. The collective lenses H11 to H15 are used for collecting laser beams B11 to B15, emitted divergently from the GaN semiconductor lasers LD11 to LD15. The GaN semiconductor lasers LD11 to LD15 are disposed so that the respective optical axes are directed to a point on the entrance end face of the core 251a of a multi-mode optical fiber 251. The collective lenses H11 to H15 are disposed so that the laser beams B11 to B15 converge at the point on the entrance end face of the core 251a.

As an example of the multi-mode optical fiber 251, the core 251a of 50 μm in diameter is covered with a cladding layer 251b having a refractive index lower than that of the core 251a. The multi-mode optical fiber 251 and the collective lenses H11 to H15 constitute the multiplex optics system 250. That is, the laser beams B11 to B15 collected by the collective lenses H11 to H15 are incident upon the core 251a of the multi-mode optical fiber 251 and propagate through the core 251a and are multiplexed into a single laser beam B10. The laser beam B10 emerges from the multi-mode optical fiber 251.

In the third embodiment, the maximum incidence angle θ of the laser beams B11 to B15 is set so that it is within the maximum acceptance angle θmax corresponding to the NA of the multi-mode optical fiber 251. In the case of NA=0.2, for instance, the maximum incidence angle θ is set so as to be within 11°, because θmax is 11° from sin θmax=0.2. For example, as shown in FIG. 10, in the case where five GaN semiconductor lasers LD11 to LD15 of output 50 mW are employed, and five laser beams B11 to B15 are indirect contact with one another, the maximum incidence angle θ is approximately 11° and is within 11°, when the convergent angle α of each of the laser beams B11 to B15 is 4.4°. A multiplexed laser beam B of 250 mW can be obtained.

In the case that the multiplex system mentioned above is employed, a plurality of semiconductor lasers are arrayed one-dimensionally like this embodiment. It is also possible, in order to employ a greater number of semiconductor lasers, to array said lasers two-dimensionally.

That is, in this embodiment, a plurality of semiconductor lasers are arrayed along a circular arc. However, a plurality of semiconductor lasers may be arrayed along a predetermined spherical surface. In this case, a single multi-mode optical fiber is disposed so that the center of the core end face thereof is positioned at the center of the spherical surface. With this arrangement, laser beams are emitted from the plurality of semiconductor lasers toward the core end face and are multiplexed into a single laser beam through the multi-mode optical fiber.

In addition, in the case where a plurality of semiconductor lasers are mounted in a row on a support member such as a heat block, as in the first and second embodiments described previously and a fourth embodiment to be described later, a plurality of support members each fixing a plurality of semiconductor lasers can be stacked so that a great number of semiconductor lasers can be arrayed two-dimensionally.

If a great number of semiconductor lasers are arrayed two-dimensionally in the aforementioned manner, they can be disposed in high density. As a result, a great number of laser beams are incident on a single multi-mode optical fiber, and a multiplexed laser beam with a higher output can be obtained.

Figure 11:
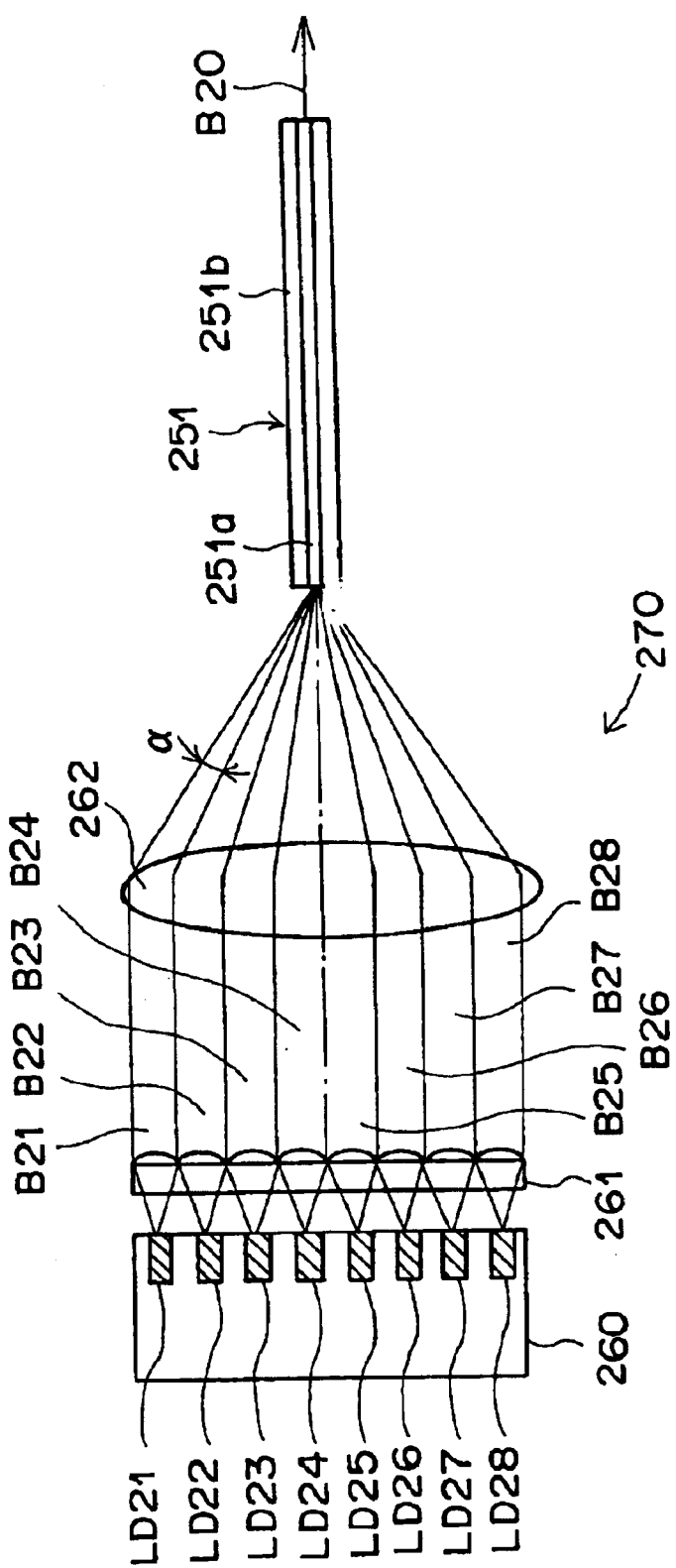
FIG. 11 is a plan view showing a multiplex laser light source according to a fourth embodiment of the present invention.

FIG. 11 shows a fourth embodiment of the present invention. The multiplex laser light source of the fourth embodiment, as with the aforementioned embodiments, is used to multiplex a plurality of laser beams of the same wavelength into a single laser beam and is constructed of 8 (eight) GaN lasers LD21 to LD28, mounted on a heat block 260 consisting of copper, and a multiplex optics system 270.

The GaN semiconductor lasers LD21 to LD28 each have, for example, an emission wavelength of 405 nm and an output of 50 mW. Laser beams B21 to B28 emitted divergently from the GaN semiconductor lasers LD21 to LD28 are collimated by a microlens array 261.

The laser beams B21 to B28 collimated by the microlens array 261 are collected by a single collective lens 262 and converge on the entrance end face of the core 251a of a multi-mode optical fiber 251. The multi-mode optical fiber 251 constitutes the multiplex optics system 270 along with the microlens array 261 and the collective lens 262. That is, the laser beams B21 to B28 collected by the collective lens 262 are incident on the core 25a of the multi-mode optical fiber 251 and propagate through the core 251a and are multiplexed into a single laser beam B20. The laser beam B20 emerges from the exit end face of the core 251a of the multi-mode optical fiber 251.

In this construction, assuming the NA of each lens of the microlens array 261 is 0.5 and that the convergent angle $\alpha$ of each beam by the collective lens 262 is 2.75°, the converged spot diameter of the laser beams B21 to B28 on the core 251a becomes about 1.4 $\mu$m. When the outputs of the GaN semiconductor lasers LD21 to LD28 are all 50 mW, the output of the multiplexed laser beam B20 becomes 400 mW. In the fourth embodiment, the 8 GaN semiconductor lasers LD21 to LD28 are bonded on the heat block 260.

Next, an image exposure apparatus, employing the ultraviolet high-brightness multiplex optical fiber module shown in FIGS. 3 to 5, will be described with reference to FIGS. 12 to 16.

Figure 12:
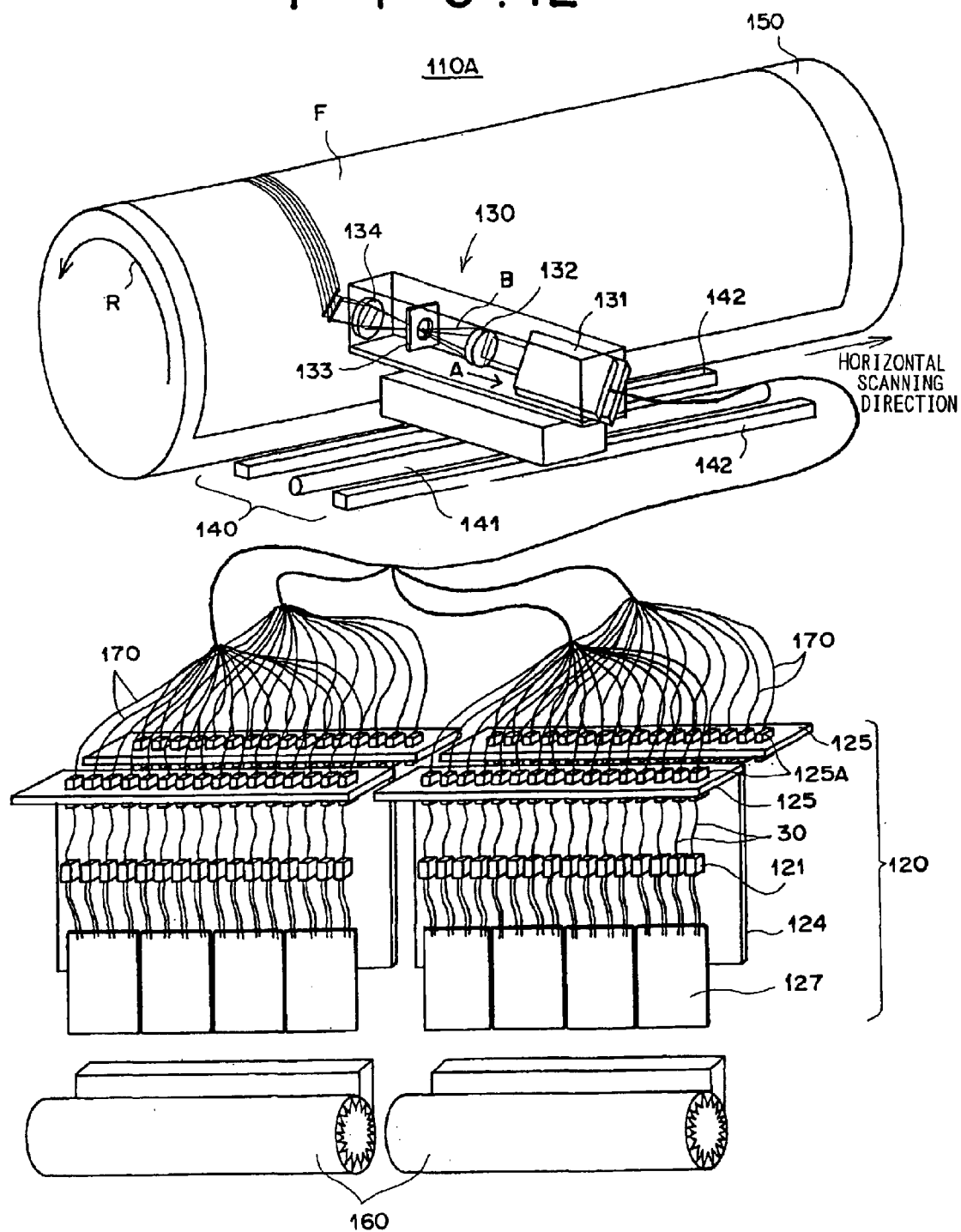
FIG. 12 is a perspective view showing an exposure apparatus according to a fifth embodiment of the present invention.

FIG. 12 shows the construction of the image exposure apparatus 110A in its entirety. As shown in the figure, the image exposure apparatus 110A includes (1) a light source unit 120 for generating a plurality of laser beams; (2) an exposure head 130 for collecting the laser beams generated by the exposure unit 120; (3) an exposure-head moving section 140 for moving the exposure head 130 in a horizontal scanning direction; (4) a drum 150, on which a recording medium F recording an image is wound, and which is rotated in the direction of arrow R in FIG. 12 so that the storage medium F is moved in a vertical scanning direction; and (5) a cooling blower 160 for generating a cooling wind to cool the light source unit 120 primarily.

The recording medium F is a flexible recording material, which can be wound on the drum 150, such as photosensitive or thermosensitive film, a photosensitive or thermosensitive plate, etc. The present invention is applicable not only to the case where the recording medium F is wound on the drum 150, but also to the case where the drum 150 itself is photosensitive or thermosensitive.

The light source unit 120 is equipped with light-source boards 124, adapter boards 125, and LD driver boards 127. A plurality of ultraviolet high-brightness multiplex fiber modules (hereinafter referred to simply as multiplex fiber modules) 121 (each multiplex fiber module is shown in FIGS. 3 to 5) are mounted on the top surface of each light-source board 124. The bottom surface of each light-source board 124 is provided with a heat radiating fin 123 (see FIG. 13). Each adapter board 125 is attached at right angles to one end of the corresponding light-source board 124 and is provided with a plurality of adapters for SC-type optical connectors 125A (which correspond in number to the multiplex fiber modules 121). Each LD driver board 127 is attached to the other end of the corresponding light-source board 124 in a horizontal direction and is provided with an LD driver circuit 126 (see FIG. 15) which drives the multiplex fiber modules 121 according to the image data of an image recorded on the recording medium F.

The other end of each optical fiber 30 connected to the multiplex fiber module 121 is provided with a plug for the SC-type optical connector 125A. The plug is fitted into one insertion hole of the adapter provided on the adapter board 125. Therefore, the laser beam emitted from each multiplex fiber module 121 is transmitted to approximately the central portion of the adapter provided on the adapter board 125.

Each driving-signal output terminal, for the multiplex fiber module 21, of the LD driver circuit 126 provided on the LD driver board 127 is connected individually and independently to the corresponding multiplex fiber module 121. Therefore, each multiplex fiber module 121 is individually and independently controlled by the LD driver circuit 126.

The exposure head 130 is equipped with a fiber array section 131 for emitting the laser beams B emitted from the aforementioned plurality of multiplex fiber modules 121. The laser beams B emitted from the multiplex fiber modules 121 are transmitted to the fiber array section 131 through a plurality of multi-mode optical fibers 170. Each multi-mode optical fiber 170 has an adapter for the SC-type optical connector at one end thereof, the adapter being fitted into the other insertion hole of each adapter provided on each adapter board 125.

Figure 14:
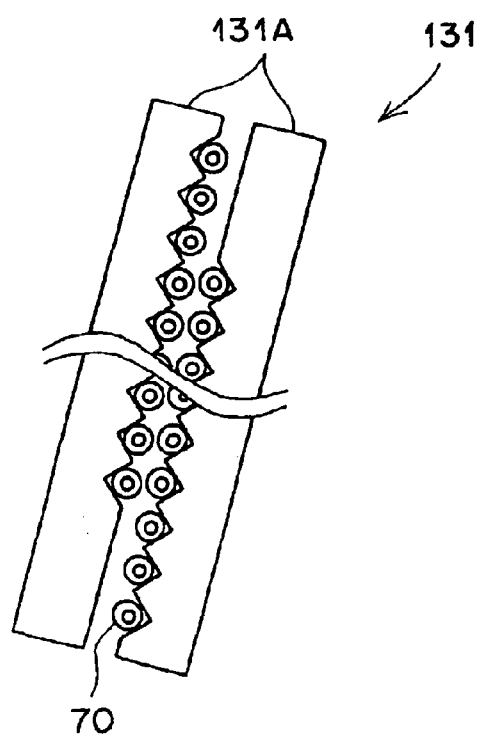
FIG. 14 is a front view of the fiber array section of the exposure apparatus shown in FIG. 12.

FIG. 14 shows a front view of the fiber array section 131 taken in the direction of arrow A in FIG. 12. As shown in FIG. 14, the fiber array section 131 is constructed of two fiber array plates 131A. Each fiber array plate 131A has V-shaped grooves, which are equal to one-half the number of the multiplex fiber modules 121. The two fiber array plates 131A are disposed so that the V-shaped grooves face each other, and the other end portion of each multi-mode optical fiber 170 is fitted in the V-shaped groove. Therefore, a plurality of laser beams emitted from the multiplex fiber modules 121 are emitted simultaneously from the fiber array section 131 at predetermined intervals.

As shown in FIG. 12, in the exposure head 130, a collimator lens 132, an aperture mask 133, and an imaging lens 134 are disposed in order from the fiber array section 131. The aperture mask 133 is disposed so that the aperture thereof is at the position of a far field measured from the beam exit end of the fiber array section 131. With the aperture mask 133, the same effect of limiting a quantity of light can be given to all of the laser beams B of the fiber array section 131, emitted from the exit ends of the optical fibers 170.

The exposure-head moving section 140 is equipped with a bore screw 141 and two rails 142, which are disposed so that they extend along the horizontal scanning direction. If a horizontal-scanning motor 143 for driving the pole screw 141 is operated, the exposure head 130 meshing with the bore screw 141 is moved along the rails 142 in the horizontal scanning direction.

On the other hand, if a vertical-scanning motor 151 (see FIG. 15) is operated, the drum 150 is rotated in the direction of arrow R shown in FIG. 12 and therefore vertical scanning is performed.

Figure 13:
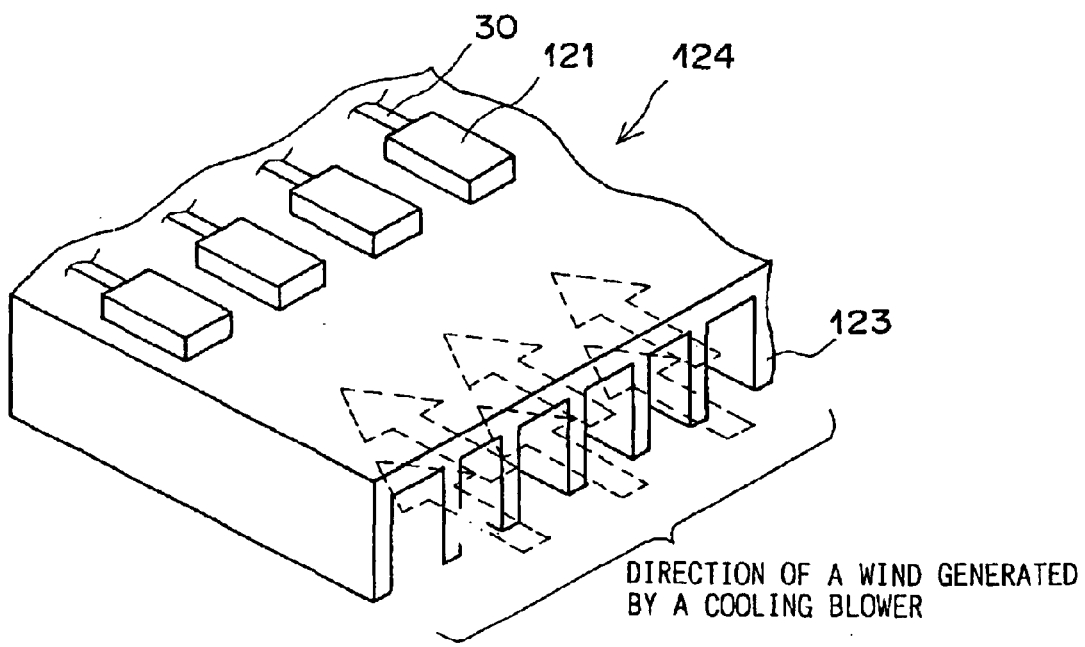
FIG. 13 is a perspective view of the light-source board of the exposure apparatus shown in FIG. 12.

The cooling blower 160, as shown in FIGS. 12 and 13, is disposed so that the radiating fin 123 and all the optical fibers 30, provided on the light-source board 124, are exposed to the cooling wind generated by the blower 160. Therefore, with the cooling wind generated by the cooling blower 160, the temperature rise of each multiplex fiber module 121 during operation can be suppressed and each optical fiber 30 can be forcibly vibrated.

Figure 15:
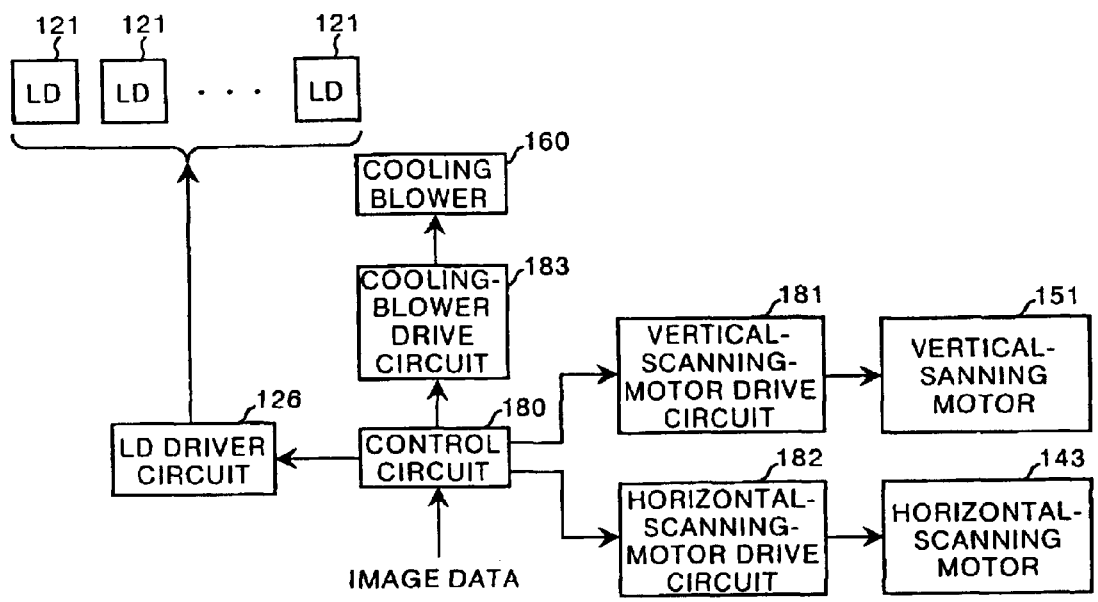
FIG. 15 is a block diagram showing the electrical construction of the exposure apparatus.

FIG. 15 shows the construction of the control system of the image exposure apparatus 110A. As shown in the figure, the control system is equipped with (1) the aforementioned LD driver circuit 126 for driving each multiplex fiber module 121 according to image data, (2) a vertical-scanning-motor drive circuit 181 for driving the vertical-scanning motor 151, (3) a horizontal-scanning-motor drive circuit 182 for driving the horizontal-scanning motor 143, (3) a cooling-blower drive circuit 183 for driving the cooling blower 160, and (4) a control circuit 180 for controlling the LD driver circuit 126, the vertical-scanning-motor drive circuit 181, the horizontal-scanning-motor drive circuit 182, and the cooling-blower drive circuit 183. The image data, representing an image which is recorded on the recording medium F, is supplied to the control circuit 180.

Figure 16:
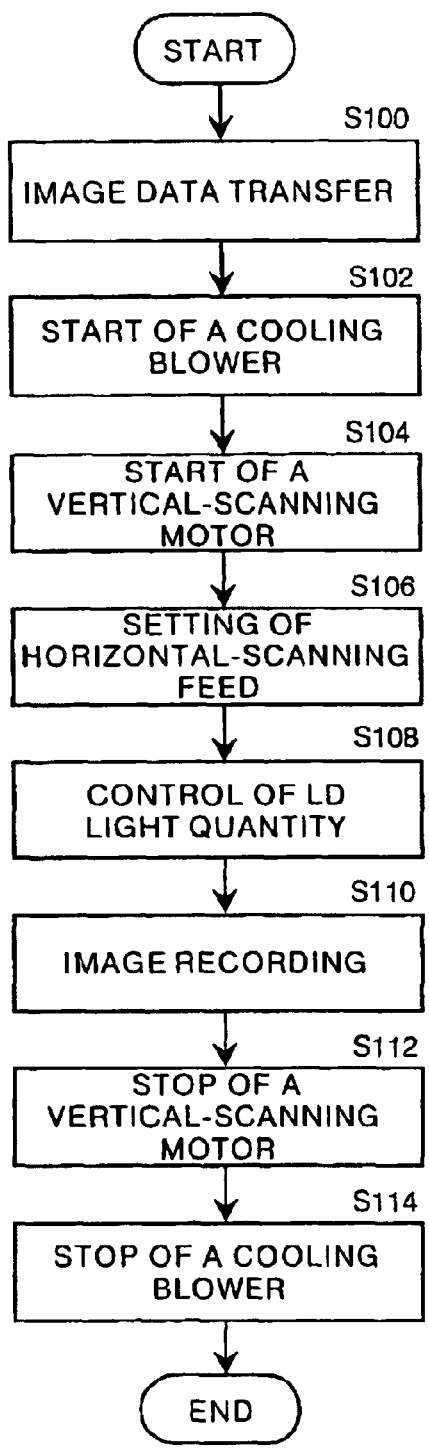
FIG. 16 is a flowchart showing how an image is recorded by the exposure apparatus.

Next, operation of the image exposure apparatus 110A constructed as described above will be described with reference to a flowchart shown in FIG. 16.

Initially, image data carrying an image which is to be recorded on the recording medium F is transmitted from an image memory (not shown), in which the image data is temporarily stored when recording the image, to the control circuit 180 (step S100). The control circuit 180 makes adjustments, based on the transmitted image data and the resolution data which represents a predetermined resolution for the image, and supplies an adjusted signal to the LD driver circuit 126, the vertical-scanning-motor drive circuit 181, and the horizontal-scanning-motor drive circuit 182.

Next, the control circuit 180 controls the cooling-blower drive circuit 183 to drive the cooling blower 160 (step S102). Therefore, with the cooling wind generated by the cooling blower 160, the operation of cooling each multiplex fiber module 121 is started and the vibration of each optical fiber 30 is started.

If each optical fiber 30 is vibrated so that a fluctuation in the quantity of the light emitted from the optical fiber becomes random during the time that vertical scanning is performed once, unevenness in the image recorded on the recording medium F can be reduced. Hence, in this embodiment, the quantity of wind, required for producing such vibration, and required for the cooling of the radiating fin 123 which is the original object, is calculated beforehand by experiments, computer simulation, etc., and the cooling-blower drive circuit 18 controls the cooling blower 160 so that the calculated wind quantity is obtained.

Next, based on the signal supplied from the control circuit 180, the vertical-scanning-motor drive circuit 181 controls the vertical-scanning motor 151 to rotate the drum 150 in the direction of arrow R at a speed corresponding to the above-mentioned resolution (step S104). The horizontal-scanning-motor drive circuit 182 determines the amount that the exposure head 130 is fed according to the above-mentioned resolution in the horizontal scanning direction by the horizontal-scanning motor 143 (step S106).

Next, the LD driver circuit 126 drives and controls the multiplex fiber modules 121 according to the image data (step S108).

The laser beams B emitted from the multiplex fiber modules 121 are emitted from the fiber array section 131 through the optical fibers 30, the SC-type connectors 125A, and the optical fibers 170. The laser beams B emitted from the fiber array section 131 are collimated by the collimator lens 132 and are limited in light quantity by the aperture plate 133. Then, the laser beams B are collected to the recording medium F on the drum 150 through the imaging lens 134.

In this case, a plurality of beam spots are formed on the recording medium F according to a plurality of laser beams B emitted from the multiplex fiber modules 121. If these spots are formed, the exposure head 130 is moved in the horizontal scanning direction at the feed pitches determined in the aforementioned step S106, and with rotation of the drum 150 started in the aforementioned step S106, a two-dimensional image is exposed and recorded on the recording medium F so that the resolution thereof becomes the resolution indicated by the aforementioned resolution data (step S110).

If the recording of the two-dimensional image onto the recording medium F ends, the vertical-scanning-motor drive circuit 181 stops the rotation of the vertical-scanning motor 151 (step S112), and the control circuit 180 controls the cooling-blower drive circuit 183 so that the operation of the cooling blower 160 is stopped (step S114). Thereafter, this process ends.

With the aforementioned process, a two-dimensional image with a predetermined resolution is recorded on the recording medium F, and the cooling blower 160 is operated during image recording. Therefore, the optical fiber 30 is randomly vibrated so that white noise can be superposed on the laser beams propagating through the optical fiber 30. As a result, image unevenness, such as swath unevenness, beat unevenness, etc., can be prevented from occurring in the recorded two-dimensional image.

While the present invention has been described with reference to the preferred embodiments thereof, the invention is not to be limited to the details given herein, but may be modified within the scope of the invention hereinafter claimed.

What is claimed is:

1. A multiplex laser light source comprising:
    a plurality of semiconductor lasers;
    a single multi-mode optical fiber; and
    a light-collecting optics system for collecting laser beams emitted from said plurality of semiconductor lasers and then coupling the collected laser beams to said multi-mode optical fiber, said light-collecting optics system comprising a plurality of collimator lenses, each having a first aperture diameter in said first direction and a second aperture diameter larger than said first aperture diameter in a second direction perpendicular to said first direction, and provided so that they correspond to each of said plurality of said semiconductor lasers.

2. The multiplex laser light source as set forth in claim 1, wherein
    said plurality of semiconductor lasers are disposed so that their light-emitting points are arranged in a row in a first direction parallel to their active layers; and
    said light-collecting optics system comprises
    a collective lens for collecting said plurality of laser beams collimated by said plurality of collimator lenses and then converging the collimated laser beams on an end face of said multi-mode optical fiber.

3. The multiplex laser light source as set forth in claim 2, wherein said plurality of collimator lenses are formed integrally with one another and are constructed as a lens array.

4. The multiplex laser light source as set forth in claim 1, wherein a block on which said plurality of semiconductor lasers are mounted is divided into a plurality of subblocks, and said subblocks are bonded together with one another.

5. The multiplex laser light source as set forth in claim 2, wherein a block on which said plurality of semiconductor lasers are mounted is divided into a plurality of subblocks, and said subblocks are bonded together with one another.

6. The multiplex laser light source as set forth in claim 3, wherein a block on which said plurality of semiconductor lasers are mounted is divided into a plurality of subblocks, and said subblocks are bonded together with one another.

7. The multiplex laser light source as set forth in claim 1, wherein said semiconductor lasers are GaN semiconductor lasers.

8. The multiplex laser light source as set forth in claim 2, wherein said semiconductor lasers are GaN semiconductor lasers.

9. The multiplex laser light source as set forth in claim 3, wherein said semiconductor lasers are GaN semiconductor lasers.

10. The multiplex laser light source as set forth in claim 4, wherein said semiconductor lasers are GaN semiconductor lasers.

11. The multiplex laser light source as set forth in claim 1, wherein said multi-mode optical fiber has a core diameter of 50 μm or less and a numerical aperture of 0.3 or less.

12. The multiplex laser light source as set forth in claim 2, wherein said multi-mode optical fiber has a core diameter of 50 μm or less and a numerical aperture of 0.3 or less.

13. The multiplex laser light source as set forth in claim 3, wherein said multi-mode optical fiber has a core diameter of 50 μm or less and a numerical aperture of 0.3 or less.

14. The multiplex laser light source as set forth in claim 4, wherein said multi-mode optical fiber has a core diameter of 50 μm or less and a numerical aperture of 0.3 or less.

15. The multiplex laser light source as set forth in claim 7, wherein said multi-mode optical fiber has a core diameter of 50 μm or less and a numerical aperture of 0.3 or less.

16. The multiplex laser light source as set forth in claim 1, wherein a value of (core diameter×numerical aperture) of said multi-mode optical fiber is 7.5 μm or less.

17. The multiplex laser light source as set forth in claim 2, wherein a value of (core diameter×numerical aperture) of said multi-mode optical fiber is 7.5 μm or less.

18. The multiplex laser light source as set forth in claim 3, wherein a value of (core diameter×numerical aperture) of said multi-mode optical fiber is 7.5 μm or less.

19. The multiplex laser light source as set forth in claim 4, wherein a value of (core diameter×numerical aperture) of said multi-mode optical fiber is 7.5 μm or less.

20. The multiplex laser light source as set forth in claim 7, wherein a value of (core diameter×numerical aperture) of said multi-mode optical fiber is 7.5 μm or less.

21. The multiplex laser light source as set forth in claim 11, wherein a value of (core diameter×numerical aperture) of said multi-mode optical fiber is 7.5 μm or less.

22. The multiplex laser light source as set forth in claim 1, wherein said plurality of semiconductor lasers comprise 3 to 10 semiconductor lasers arranged in a row.

23. The multiplex laser light source as set forth in claim 2, wherein said plurality of semiconductor lasers comprise 3 to 10 semiconductor lasers arranged in a row.

24. The multiplex laser light source as set forth in claim 3, wherein said plurality of semiconductor lasers comprise 3 to 10 semiconductor lasers arranged in a row.

25. The multiplex laser light source as set forth in claim 4, wherein said plurality of semiconductor lasers comprise 3 to 10 semiconductor lasers arranged in a row.

26. The multiplex laser light source as set forth in claim 7, wherein said plurality of semiconductor lasers comprise 3 to 10 semiconductor lasers arranged in a row.

27. The multiplex laser light source as set forth in claim 11, wherein said plurality of semiconductor lasers comprise 3 to 10 semiconductor lasers arranged in a row.

28. The multiplex laser light source as set forth in claim 16, wherein said plurality of semiconductor lasers comprise 3 to 10 semiconductor lasers arranged in a row.

29. The multiplex laser light source as set forth in claim 22, wherein said plurality of semiconductor lasers comprise 6 or 7 semiconductor lasers arranged in a row.

30. The multiplex laser light source as set forth in claim 1, wherein said plurality of semiconductor lasers each have a light-emitting width of 1.5 to 5 μm.

31. The multiplex laser light source as set forth in claim 2, wherein said plurality of semiconductor lasers each have a light-emitting width of 1.5 to 5 μm.

32. The multiplex laser light source as set forth in claim 3, wherein said plurality of semiconductor lasers each have a light-emitting width of 1.5 to 5 μm.

33. The multiplex laser light source as set forth in claim 4, wherein said plurality of semiconductor lasers each have a light-emitting width of 1.5 to 5 μm.

34. The multiplex laser light source as set forth in claim 7, wherein said plurality of semiconductor lasers each have a light-emitting width of 1.5 to 5 μm.

35. The multiplex laser light source as set forth in claim 11, wherein said plurality of semiconductor lasers each have a light-emitting width of 1.5 to 5 μm.

36. The multiplex laser light source as set forth in claim 16, wherein said plurality of semiconductor lasers each have a light-emitting width of 1.5 to 5 μm.

37. The multiplex laser light source as set forth in claim 22, wherein said plurality of semiconductor lasers each have a light-emitting width of 1.5 to 5 μm.

38. The multiplex laser light source as set forth in claim 29, wherein said plurality of semiconductor lasers each have a light-emitting width of 1.5 to 5 μm.

39. The multiplex laser light source as set forth in claim 30, wherein said plurality of semiconductor lasers each have a light-emitting width of 2 to 3 μm.

40. The multiplex laser light source as set forth in claim 1, wherein said plurality of semiconductor lasers are arrayed and fixed two-dimensionally when viewed from a side where said laser beams are received.

41. The multiplex laser light source as set forth in claim 2, wherein said plurality of semiconductor lasers are arrayed and fixed two-dimensionally when viewed from a side where said laser beams are received.

42. The multiplex laser light source as set forth in claim 3, wherein said plurality of semiconductor lasers are arrayed and fixed two-dimensionally when viewed from a side where said laser beams are received.

43. The multiplex laser light source as set forth in claim 4, wherein said plurality of semiconductor lasers are arrayed and fixed two-dimensionally when viewed from a side where said laser beams are received.

44. The multiplex laser light source as set forth in claim 7, wherein said plurality of semiconductor lasers are arrayed and fixed two-dimensionally when viewed from a side where said laser beams are received.

45. The multiplex laser light source as set forth in claim 11, wherein said plurality of semiconductor lasers are arrayed and fixed two-dimensionally when viewed from a side where said laser beams are received.

46. The multiplex laser light source as set forth in claim 16, wherein said plurality of semiconductor lasers are arrayed and fixed two-dimensionally when viewed from a side where said laser beams are received.

47. The multiplex laser light source as set forth in claim 22, wherein said plurality of semiconductor lasers are arrayed and fixed two-dimensionally when viewed from a side where said laser beams are received.

48. The multiplex laser light source as set forth in claim 29, wherein said plurality of semiconductor lasers are arrayed and fixed two-dimensionally when viewed from a side where said laser beams are received.

49. The multiplex laser light source as set forth in claim 30, wherein said plurality of semiconductor lasers are arrayed and fixed two-dimensionally when viewed from a side where said laser beams are received.

50. The multiplex laser light source as set forth in claim 39, wherein said plurality of semiconductor lasers are arrayed and fixed two-dimensionally when viewed from a side where said laser beams are received.

51. The multiplex laser light source as set forth in any one of claims 1 to 50, wherein said multi-mode optical fiber comprises a plurality of multi-mode optical fibers in which at least exit end portions thereof are disposed in one-dimensional array form, and each of said plurality of multi-mode optical fibers is combined with said plurality of semiconductor lasers and said light-collecting optics system.

52. The multiplex laser light source as set forth in any one of claims 1 to 50, wherein said multi-mode optical fiber comprises a plurality of multi-mode optical fibers in which at least exit end portions thereof are disposed in bundle form, and each of said plurality of multi-mode optical fibers are combined with said plurality of semiconductor lasers and said light-collecting optics system.

53. An exposure apparatus with a light source, wherein said light source comprises the multiplexer laser light source as set forth in claim 51.

54. An exposure apparatus with a light source, wherein said light source comprises the multiplexer laser light source as set forth in claim 52.

* * * * *